United States Patent
Chen et al.

(10) Patent No.: US 9,349,469 B2
(45) Date of Patent: May 24, 2016

(54) PROGRAM VERIFY WITH MULTIPLE SENSING

(71) Applicant: Macronix International Co., Ltd., Hsinchu (TW)

(72) Inventors: Chung-Kuang Chen, Hsinchu (TW); Han-Sung Chen, Hsinchu (TW); Chun-Hsiung Hung, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/505,297

(22) Filed: Oct. 2, 2014

(65) Prior Publication Data

US 2016/0099069 A1 Apr. 7, 2016

(51) Int. Cl.
*G11C 16/06* (2006.01)
*G11C 16/26* (2006.01)
*G11C 16/10* (2006.01)
*G11C 16/34* (2006.01)

(52) U.S. Cl.
CPC .............. *G11C 16/26* (2013.01); *G11C 16/10* (2013.01); *G11C 16/3459* (2013.01)

(58) Field of Classification Search
CPC ..... G11C 16/26; G11C 16/10; G11C 16/3459
USPC ........................................ 365/185.21, 185.22
See application file for complete search history.

(56) References Cited

U.S. PATENT DOCUMENTS

| | | | |
|---|---|---|---|
| 8,792,285 B2 | 7/2014 | Hung | |
| 2001/0014037 A1 | 8/2001 | Kim et al. | |
| 2005/0248991 A1 | 11/2005 | Lee et al. | |
| 2006/0209592 A1* | 9/2006 | Li | G11C 11/5642 365/185.03 |
| 2006/0221697 A1 | 10/2006 | Li et al. | |
| 2007/0091681 A1 | 4/2007 | Gongwer et al. | |
| 2007/0147121 A1 | 6/2007 | Futatsuyama | |
| 2009/0003052 A1* | 1/2009 | Li | G11C 11/5628 365/185.02 |
| 2009/0031075 A1 | 1/2009 | Kim | |
| 2009/0034329 A1* | 2/2009 | Shibata | G11C 16/0483 365/185.03 |
| 2010/0302852 A1 | 12/2010 | Oh | |

* cited by examiner

*Primary Examiner* — Tha-O H Bui
(74) *Attorney, Agent, or Firm* — Haynes Beffel & Wolfeld LLP

(57) ABSTRACT

A sense circuit is coupled to a bit line of a memory array. Control circuitry coupled to the sense circuit controls a program operation for a memory cell. After a program phase in which the memory cell in the memory array is programmed, in a program verify phase the control circuitry causes the sense circuit to sense data stored on the memory cell multiple times during the program verify phase. The multiple times include a first time sensing data from the memory cell and a second time sensing data from the memory cell.

18 Claims, 13 Drawing Sheets

PROGRAM VERIFY WITH MULTIPLE SENSING

BACKGROUND

1. Field of the Invention

This technology relates to a sense circuit.

2. Description of Related Art

In a program operation flow which includes program and program verify phases, the Fast Program Write (FPW) algorithm is accompanied by a FPW program verify algorithm. The FPW algorithm can result in memory cells that nearly pass program verify, but ultimately fail. For more accurate judgment of whether a memory cell has been programmed successfully, the FPW algorithm increases the number of program verify cycles when a programmed memory cell fails program verify. Thus the FPW program operation flow comes with a serious speed penalty. In some cases, the number of program verify cycles is as much as doubled in response to a program verify failure.

One approach to address failures in program verify, is to decrease the step voltage during programming such as Incremental Step Pulse Programming (ISPP). However, although a decreased programming step voltage improves programming accuracy, the decreased programming step voltage also results in a serious speed penalty.

It would be desirable to improve the results of the program operation flow without an accompanying speed penalty.

SUMMARY

One aspect of the technology is a sense circuit coupled to a bit line of a memory array, and control circuitry coupled to the sense circuit. The control circuitry controls a program operation for a memory cell which can be accessed by the sense circuit. The program operation includes a program phase in which the memory cell in the memory array is programmed, and a program verify phase in which the control circuitry causes the sense circuit to sense data stored on the memory cell multiple times during the program verify phase of the program operation. The multiple times include a first time sensing data from the memory cell and a second time sensing data from the memory cell.

One embodiment of the technology further comprises a word line applying a voltage with only a non-zero value to the memory cell. This can occur during the first time, in between the first and second times, and during the second time.

One embodiment of the technology further comprises a pass transistor coupling the bit line to the sense circuit. The control circuitry causes the pass transistor to turn on, to sense the data for the first time and sense the data for the second time. The control circuitry can turn off the pass transistor to decouple the sense circuit from the bit line in an interval after the first time and before the second time.

In one embodiment of the technology, the sense node has a voltage capacitively coupled to a sense level signal. The control circuitry causes the sense level signal to lower the sense node voltage prior (i) to sensing the data for the first time and then cause the sense level signal to raise the sense node voltage after the first time, and (ii) to sense the data for the second time and then cause the sense level signal to raise the sense node voltage after the second time.

In one embodiment of the technology, the bit line has a constant voltage while the control circuitry senses the data for the first time and the data for the second time.

Some embodiments of the technology further comprises a pass transistor coupling the bit line to a sense node of the sense circuit. The control circuitry causes the pass transistor to receive a first gate voltage during the first time sensing the data. The control circuitry causes the pass transistor to receive a second gate voltage during the second time sensing the data. In some embodiment of the technology, the first gate voltage and the second gate voltage are equal. In other embodiments of the technology, the first gate voltage and the second gate voltage are unequal. In one embodiment of the technology, the second gate voltage is less than the first gate voltage. In various embodiments of the technology, the second gate voltage is higher, or lower, than the first gate voltage. In one embodiment of the technology, magnitudes of the second gate voltage and the first gate voltage are determined by a main bit line voltage of a main bit line coupled to the bit line.

One embodiment of the technology further comprises a main bit line, and a plurality of local bit lines coupled to the main bit line. The plurality of local bit lines includes a bit line coupled to the memory cell. The control circuitry does not refresh a main bit line voltage of the main bit line. This can be during the first time, in between the first and second times, and during the second time.

Some embodiments of the technology further comprise a sense node of the sense circuit. The control circuitry causes the sense node to sense the data during the first time. The control circuitry causes the sense node to sense the data during the second time. The control circuitry causes the sense node to fall to a negative voltage (i) prior to sensing the data during the first time, and (ii) prior to sensing the data during the second time.

In one embodiment of the technology, the control circuitry is coupled the sense node to a ground voltage: (i) prior to falling to the negative voltage prior to sensing the data during the first time, and (ii) prior to falling to the negative voltage prior to sensing the data during the second time.

In one embodiment of the technology, the sense node is coupled to a first gate of a first sense transistor. The first sense transistor is coupled in series with a second sense transistor. The second sense transistor has a second gate receiving a strobe signal, a first current carrying terminal is coupled to a positive reference voltage, and a second current carrying terminal coupled to the first sense transistor. The control circuitry causes the sense node to rise to a positive voltage: (i) prior to the control circuitry causing the strobe signal to turn on the second sense transistor prior to the first time, and (i) prior to the control circuitry causing the strobe signal to turn on the second sense transistor prior to the second time.

In one embodiment of the technology, the positive voltage is coupled to the sense node via a capacitor.

Another aspect of the technology is a method, of performing a multi-phase program operation on a memory cell, including:

performing a program phase in which the memory cell in the memory array is programmed; and performing a program verify phase that senses data stored on the memory cell multiple times during the program verify phase of the program operation, the multiple times including a first time sensing data from the memory cell and a second time sensing data from the memory cell.

Other aspects and embodiments are disclosed herein.

DETAILED DESCRIPTION

Figure 1:
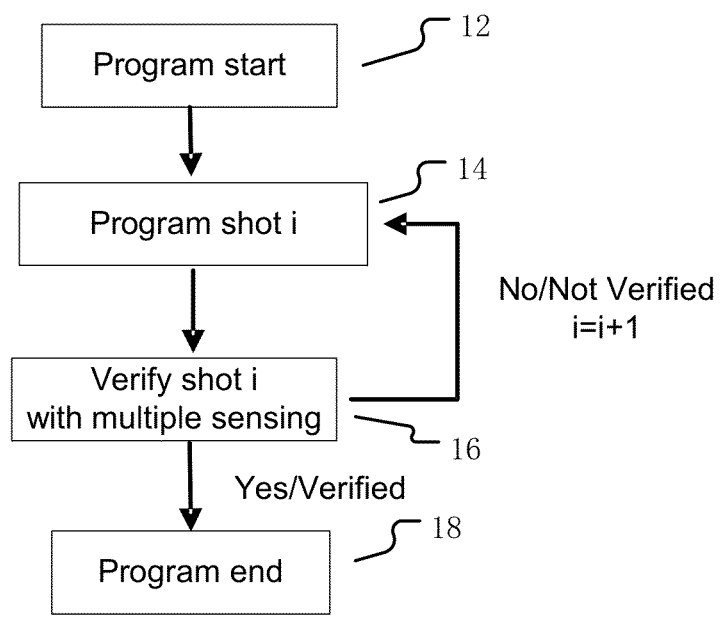
FIG. 1 is a process flow of a program operation with multiple sensing in the program verify step.

FIG. 1 is a process flow of a program operation with multiple sensing in the program verify step.

At 12 the program operation starts. A program instruction is received by the control circuitry of the integrated circuit, which includes a program instruction operation code and one or more memory addresses. Various embodiments include 2-level cell memory, multi-level cell memory, and 3-level cell memory. In an embodiment with more than a single programmed state, the program instruction can include data specifying the target programmed state, or use different program instruction codes for different target programmed states.

At 14, the control circuitry performs program shot number i, and at 16 the control circuitry performs program verify of shot number i. In the event of program verify failure, the control circuitry loops back to 14 for shot number i=i+1. If the shot number exceeds a ceiling number of program attempts, the control circuitry can end the program operation rather than continue to loop back to 14 for another program shot. In the event of program verify success, the control circuitry ends the program operation at 16. During program verify 16 in between two consecutive program shots 14, the program verify performs multiple sensing of the same programmed memory cell or same programmed memory cells which just underwent programming in 14. Alternatively, during the program verify 16 in between program shot 14, and program end 18, the program verify performs multiple sensing of the same programmed memory cell or same programmed memory cells which just underwent programming in 14.

Figure 4:
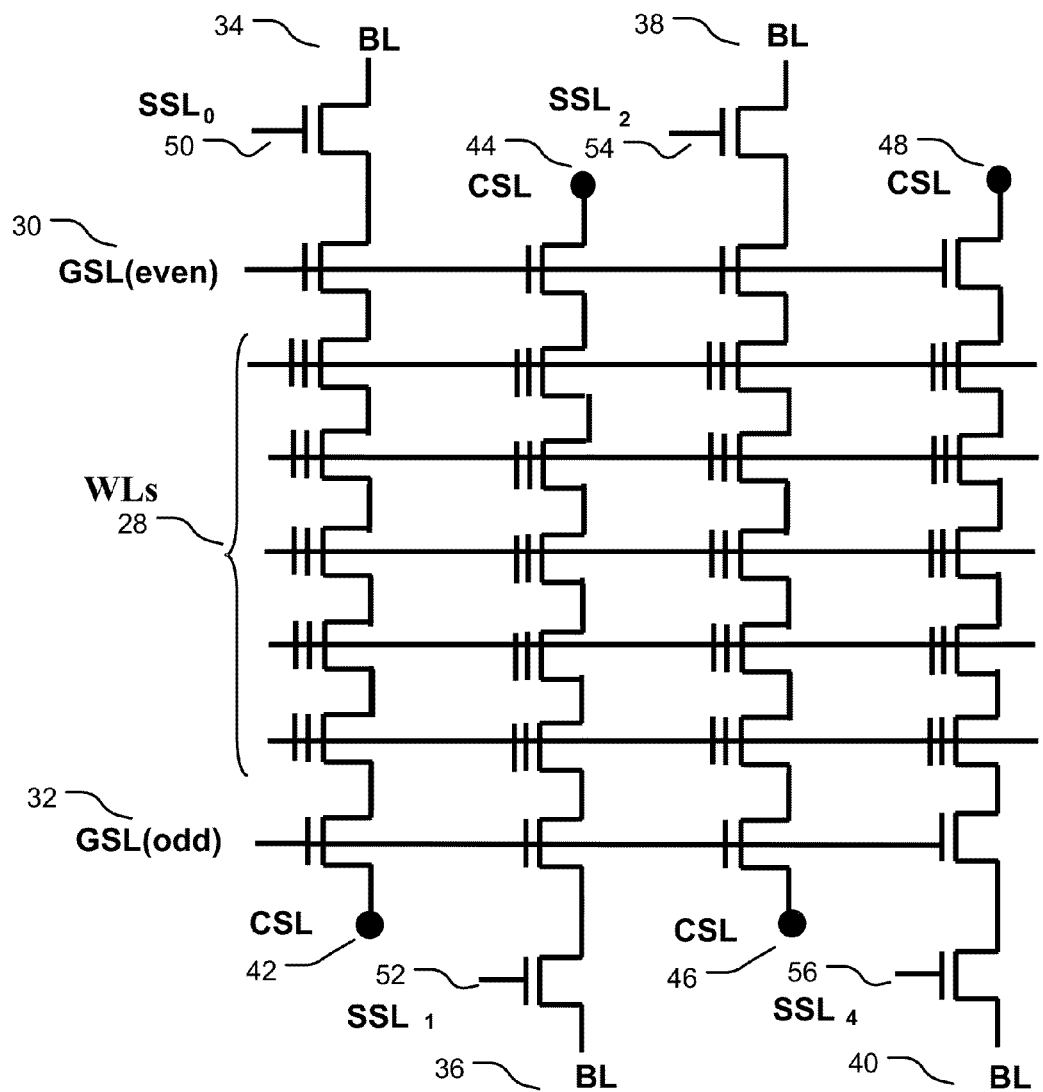
FIG. 4 is an example memory array, which undergoes multiple sensing in the program verify step of a program operation according to FIG. 1.
Figure 5:
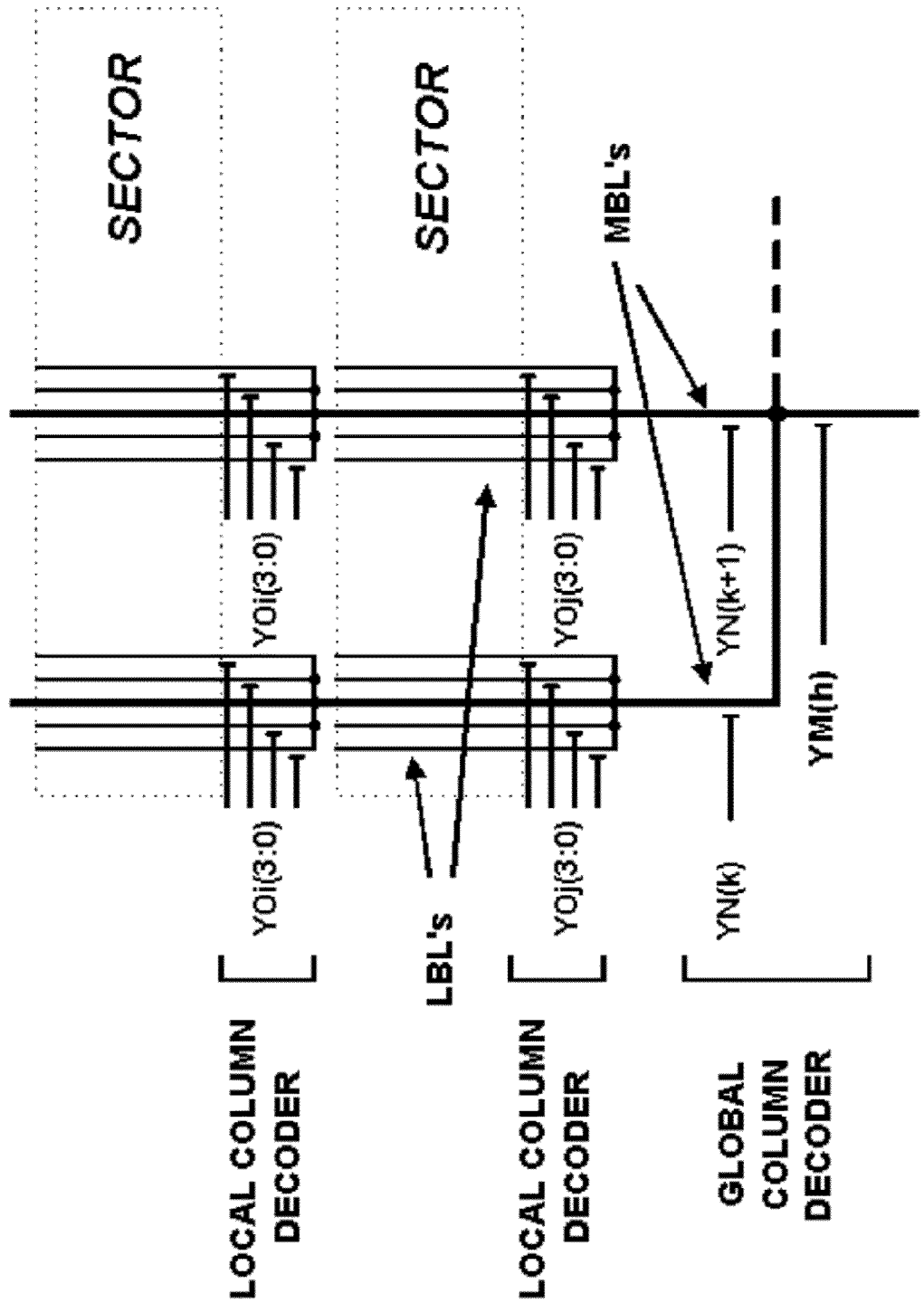
FIG. 5 is an example bit line design with main bit lines and local bit lines.
Figure 6:
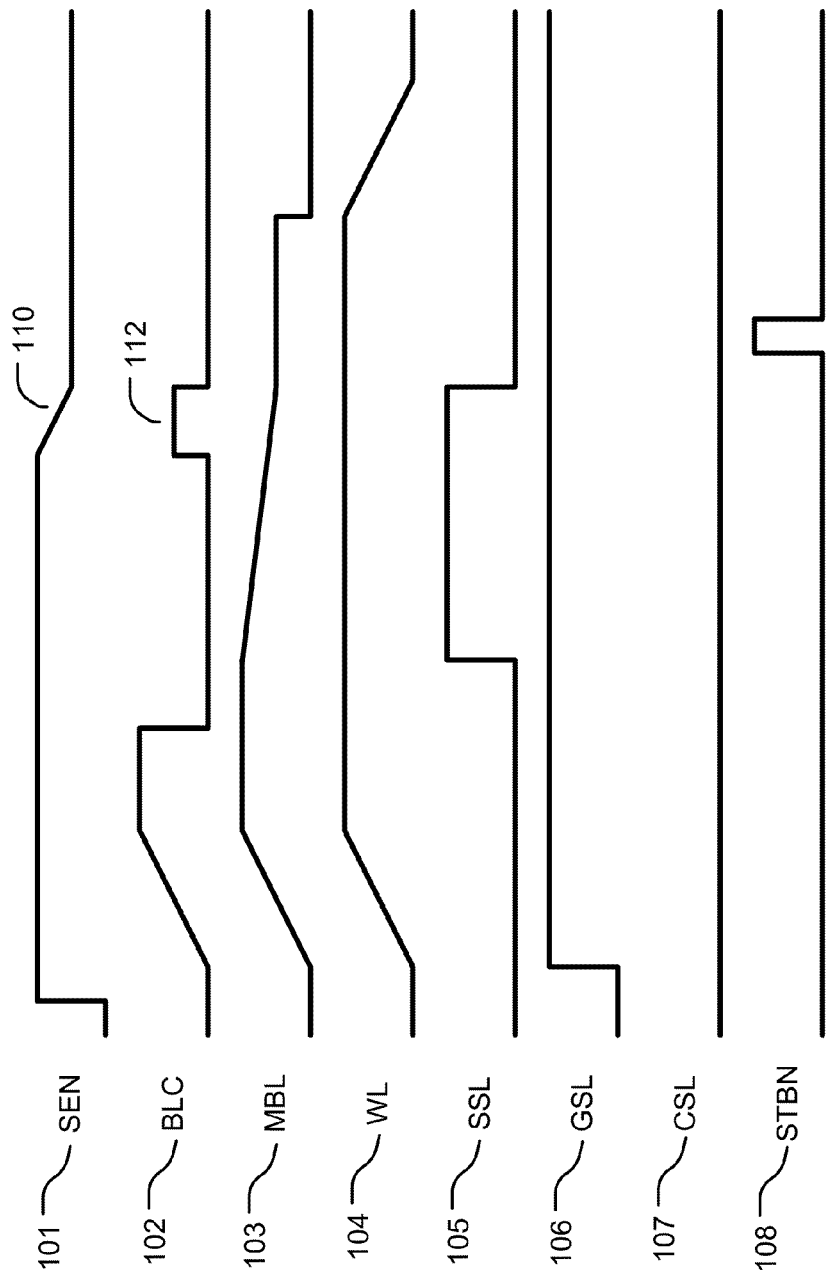
FIG. 6 is a graph of voltage traces with an example of a program verify phase which performs sensing just once.
Figure 7:
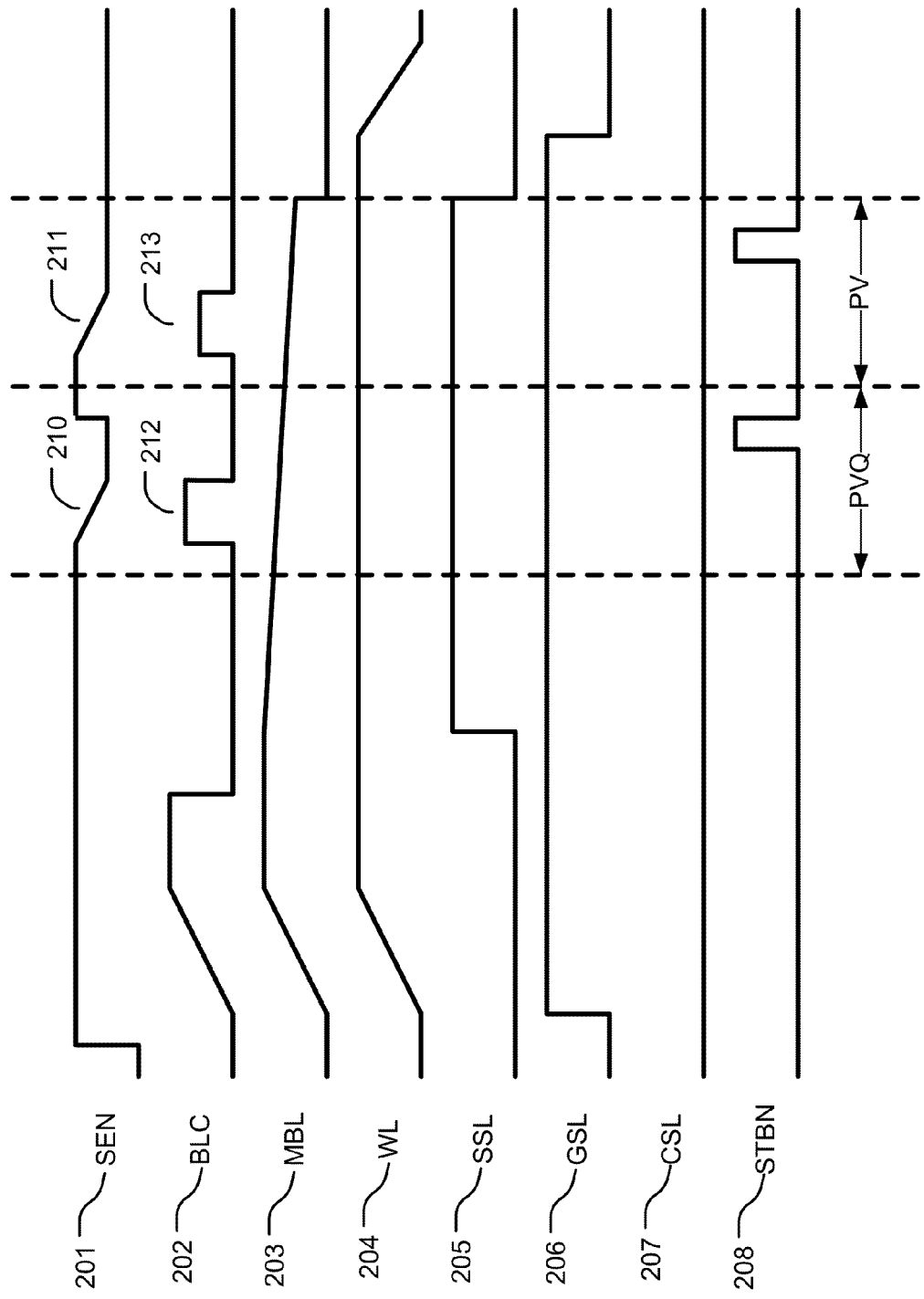
FIG. 7 is a graph of voltage traces with an example of a program verify phase which performs sensing multiple times, showing different gate voltages on the pass transistor between the sense node and the bit line.
Figure 9:
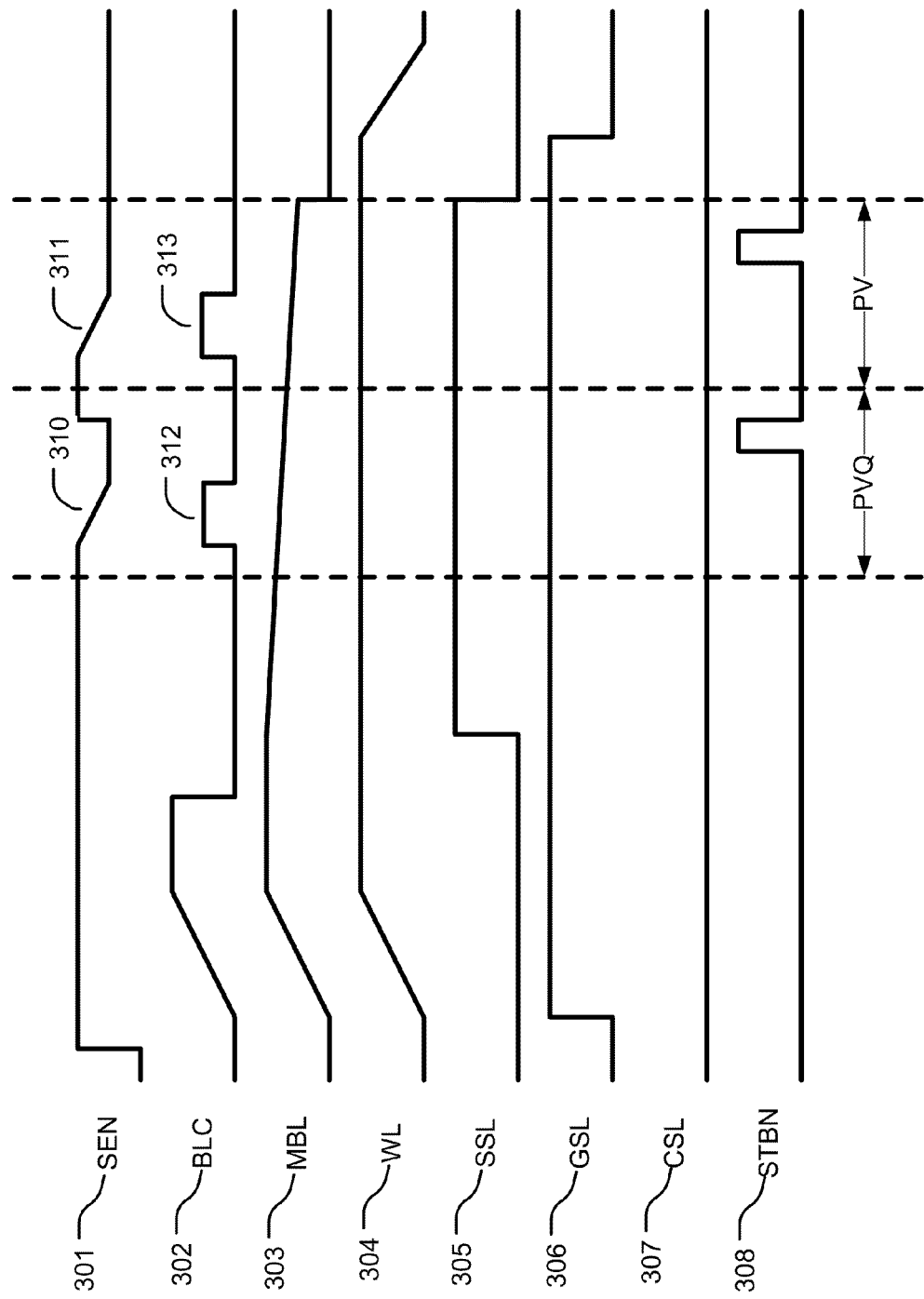
FIG. 9 is another graph of voltage traces with an example of a program verify phase which performs sensing multiple times, showing the same gate voltages on the pass transistor between the sense node and the bit line.

FIGS. 2-5 show various parts of the memory circuitry which have voltage traces that are shown in FIGS. 6, 7, and 9.

Figure 2:
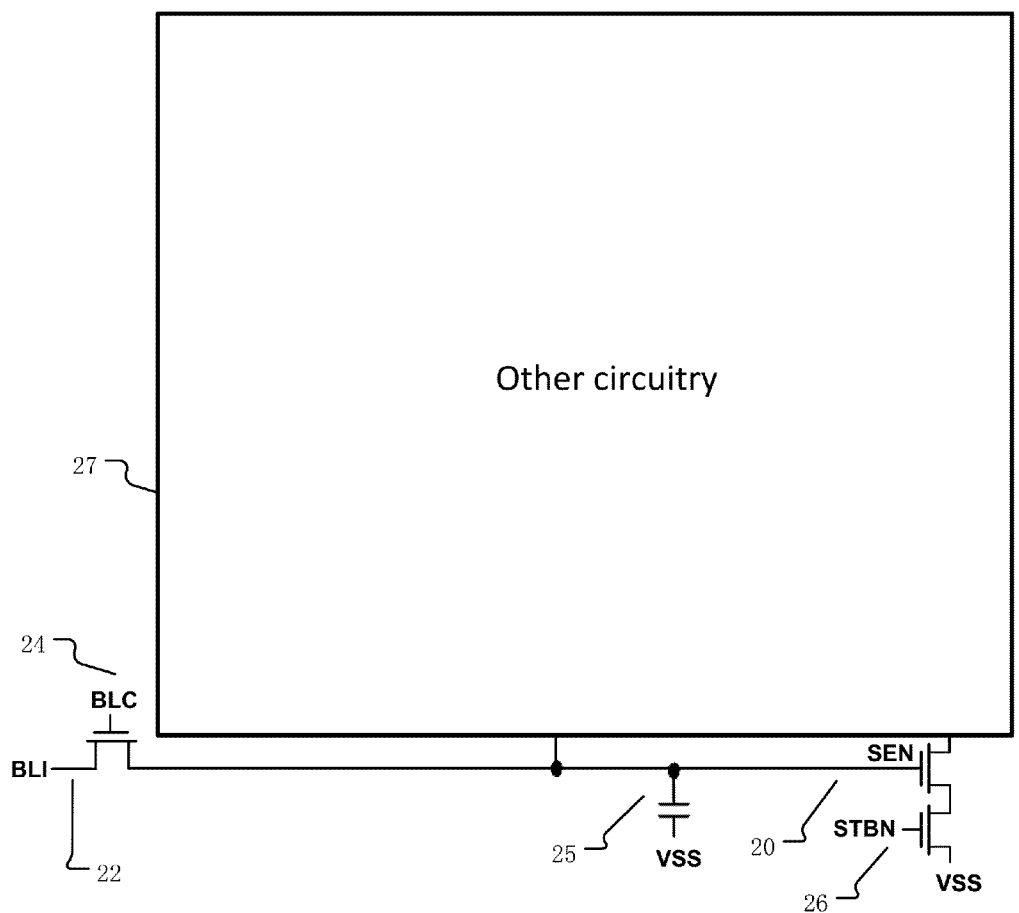
FIG. 2 is an example forward sensing page buffer circuit which performs multiple sensing in the program verify step.

FIG. 2 is an example forward sensing page buffer circuit which performs multiple sensing in the program verify step.

Bit line 22 is electrically coupled to and decoupled from sense node SEN 20 by BLC 24, bias of bit line 22, and bias of SEN 20. SEN 20 has a capacitance 25 which is discharged at a rate which depends on the data stored on a memory cell coupled to the bit line 22. Bit line bias with a large cell current during discharge is lower than the bit line bias with a small cell current. SEN 20 is coupled to the gate of a first n-type transistor. STBN 26 is coupled to the gate of a second n-type transistor. The second n-type transistor is in series with the first n-type transistor in between SEN 20 and other circuitry 27. Not shown are circuits that charge and discharge SEN 20 via paths other than BLC 24 and bit line 22.

During program verify in between two consecutive program shots, the program verify performs multiple sensing at node SEN 20 of the same programmed memory cell or same programmed memory cells which just underwent programming. Alternatively, during the program verify in between a program shot, and program end, the program verify performs multiple sensing at node SEN of the same programmed memory cell or same programmed memory cells which just underwent programming.

The sense circuit can be modified with latches to store sense data or program data. The sense circuit can be modified to rearrange or add transistors and change transistor types with appropriate signaling changes.

Figure 3:
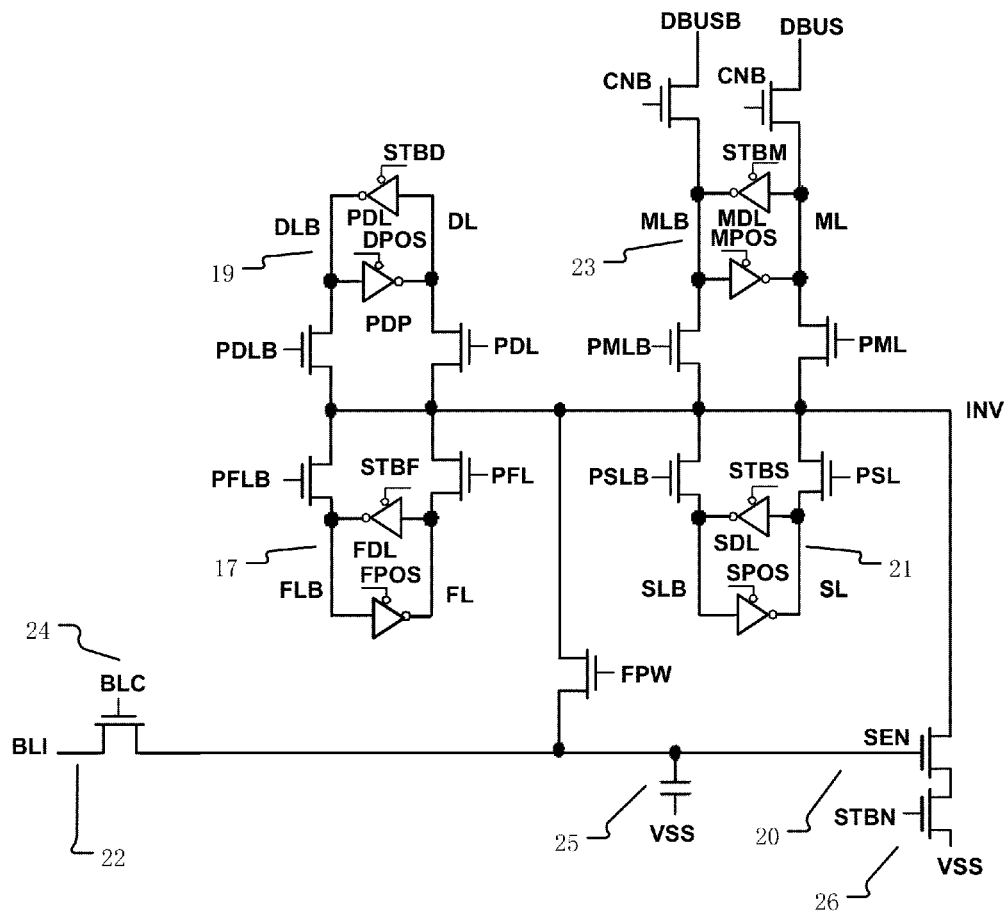
FIG. 3 is a more detailed example of the forward sensing page buffer circuit of FIG. 2.

FIG. 3 is a more detailed example of the forward sensing page buffer circuit of FIG. 2.

The page buffer circuit includes multiple latches: SDL 21, MDL 23, FDL 17, and PDL 19. The data latches SDL 21 and MDL 23 relate to programming and sensing the different bits of MLC data. The number of these data latches can be varied, based on the number of bits stored per cell.

PDL is used for a program flag, where "1" means don't program, and "0" means program during the program phase. FDL is used as a data buffer in read phase.

FIG. 4 is an example memory array, which undergoes multiple sensing in the program verify step of a program operation according to FIG. 1.

Word lines 28 access a memory array. The word lines 28 are bounded by an even ground select line 30 above and an odd ground select line 32 below.

The memory strings are shown in alternating orientations of bit line-common source line and common source line-bit line. In one embodiment, the claimed technology applies to three-dimensional nonvolatile memory arrays, and in another embodiment, the claimed technology applies to two-dimensional nonvolatile memory arrays.

Four memory strings are shown. From left to right, the memory strings include: bit line 34 to common source line 42, common source line 44 to bit line 36, bit line 38 to common source line 46, and common source line 48 to bit line 40. In each memory string, a string select transistor is in between the bit line and the ground select transistor. Each memory string includes a string select transistor, which are, in order from the far left memory string to the far right memory string, string select transistor 50, string select transistor 52, string select transistor 54, and string select transistor 56.

FIG. 5 is an example bit line design with main bit lines and local bit lines.

Global column decoder 65 selects an active one of main bit lines 60, via pass transistor signals such as YN(k) 61 or YN(k+1). The pass transistor signals controlled by the global column decoder electrically couple a selected main bit line to YM(h). Local column decoder 75 selects an active one of local bit lines 70 in memory sector 80, via pass transistor signals YOj(3:0) 71 to electrically couple to a first main bit line, and via pass transistor signals YOj(3:0) 72 to electrically couple to a second main bit line. Local column decoder 79 performs a similar function for memory sector 81 via pass transistor signals YOj(3:0) 73 and YOj(3:0) 74.

FIG. 6 is a graph of voltage traces with an example of a program verify phase which performs sensing just once.

Shown are traces SEN 101, BLC 102, MBL 103, WL 104, SSL 105, GSL 106, CSDL 107, and STBN 108. FIG. 6 shows a single program verify phase which performs sensing just once. In trace BLC 102, sensing is performed during pulse 112 when the bit line is coupled to the sense node. During sensing 110, trace SEN 101 falls from high to low, or stays almost the same, determined by the data stored on the memory cell coupled to the bit line. The program verify phase of FIG. 6 is relatively slow, because of the single sensing event during a single program verify phase.

FIG. 7 is a graph of voltage traces with an example of a program verify phase which performs sensing multiple times, showing different gate voltages on the pass transistor between the sense node and the bit line.

Shown are traces SEN 201, BLC 202, MBL 203, WL 204, SSL 205, GSL 206, CSDL 207, and STBN 208. FIG. 7 shows a single program verify phase which performs sensing multiple times. In trace BLC 202, first sensing is performed during pulse 212 when the bit line is coupled to the sense node. During first sensing 210, trace SEN 201 falls from high to low, or stays almost the same, determined by the data stored on the memory cell coupled to the bit line. At the conclusion of first sensing 210, the value of SEN is indicative of the first sense data measured from the memory cell coupled to the bit line. Between the first sensing and the second sensing, SEN is reset to the bias of the beginning setup preceding the first sensing.

In trace BLC 202, second sensing is performed during pulse 213 when the bit line is coupled to the sense node. During second sensing 211, trace SEN 201 falls from high to low at a rate, or stays almost the same, determined by the data stored on the memory cell coupled to the bit line. At the conclusion of second sensing 211, the value of SEN is indicative of the second sense data measured from the memory cell coupled to the bit line.

In FIG. 7, in trace BLC 202, the magnitudes of the first sensing pulse 212 and the second sensing pulse 213 are different. As trace MBL 203 decays, the magnitude of BLC 202 decreases. In another embodiment, the magnitude of BLC increase.

As labeled at the bottom of the voltage traces, the first sensing is called PVQ and the second sensing is called PV. PVQ refers to a program verify level, PV refers to the program target, and PVQ is lower than the PV. Because PVQ is lower than PV, PVQ has a larger tolerance. However, PVQ variation affects threshold voltage distribution width during program, and induces sensing window variation in different program cycles. The program verify phase of FIG. 7 is relatively fast, because of the multiple sensing events during a single program verify phase.

Timing of the STBN 208 trace is subject to PVT (process, voltage, temperature) variation. Timing affects the main bit line level that is sensed, and different main bit levels correspond to different cell threshold voltages. So STBN 208 timing is adjusted to compensate for PVT variation.

Figure 8:
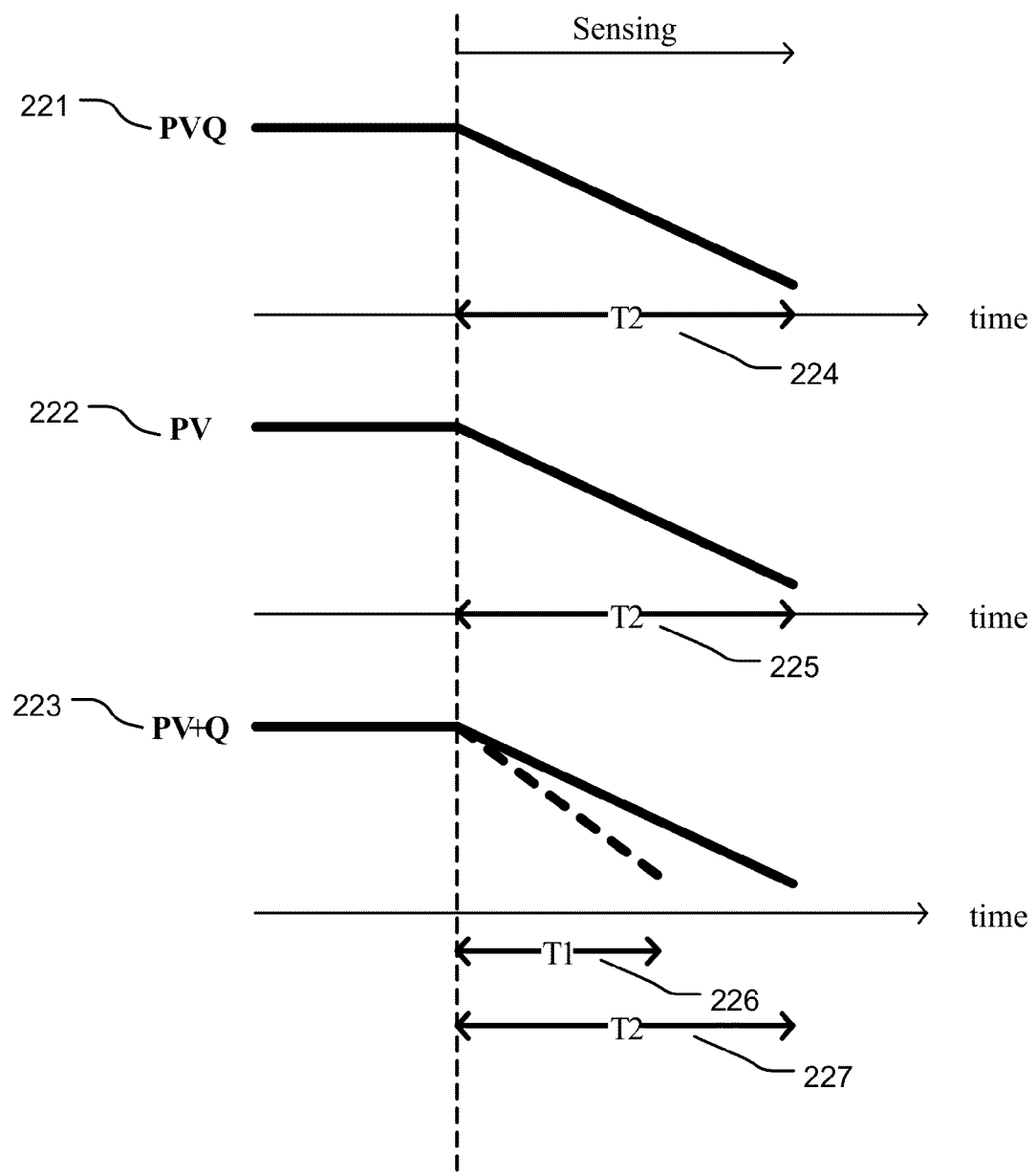
FIG. 8 is a graph of voltage traces of the main bit line during a program verify phase.

FIG. 8 is a graph of voltage traces of the main bit line during a program verify phase. Traces PVQ 221 and PV 222 correspond to the main bit line traces of consecutive but distinct program verify phases, where each program verify phase performs a single sensing, and the main difference is word line bias. The sensing period is the same T2 224 and T2 225 between Traces PVQ 221 and PV 222.

Traces PV+Q 223 correspond to the main bit line traces of a single program verify phase, in which multiple sensing performed within a single program verify phase result in different sensing periods, a shorter sensing period T1 226 for the first sensing and a longer sensing period T2 227 for the second sensing, and PVQ has the same word line bias as PV.

If the memory threshold voltage is close to PVQ, then the discharge speed is T1, due to lower threshold voltage and larger current. If the memory threshold voltage is close to PV, then the discharge speed is T2, due to higher threshold voltage and lower current.

If PVQ passes, and PV fails, then a slighter higher bias is provided to the main bit line, which decreases program strength.

FIG. 9 is another graph of voltage traces with an example of a program verify phase which performs sensing multiple times, showing the same gate voltages on the pass transistor between the sense node and the bit line.

Shown are traces SEN 301, BLC 302, MBL 303, WL 304, SSL 305, GSL 306, CSDL 307, and STBN 308. FIG. 9, like FIG. 7, shows a single program verify phase which performs sensing multiple times. In trace BLC 302, first sensing is performed during pulse 312 when the bit line is coupled to the sense node. During first sensing 310, trace SEN 301 falls from high to low, or almost stays the same, determined by the data stored on the memory cell coupled to the bit line. At the conclusion of first sensing 310, the value of SEN is indicative of the first sense data measured from the memory cell coupled to the bit line.

In trace BLC 302, second sensing is performed during pulse 313 when the bit line is coupled to the sense node. During second sensing 311, trace SEN 301 falls from high to low, or stays almost the same, determined by the data stored on the memory cell coupled to the bit line. At the conclusion of second sensing 311, the value of SEN is indicative of the second sense data measured from the memory cell coupled to the bit line.

In FIG. 9, in trace BLC 302, the magnitudes of the first sensing pulse 312 and the second sensing pulse 313 are the same. Controlling the BLC with either the same or a different bias for the first sensing or the second sensing can make the first sensing time and the second sensing time tunable. A voltage regulator can provide the same or different bias to the BLC.

Figure 10:
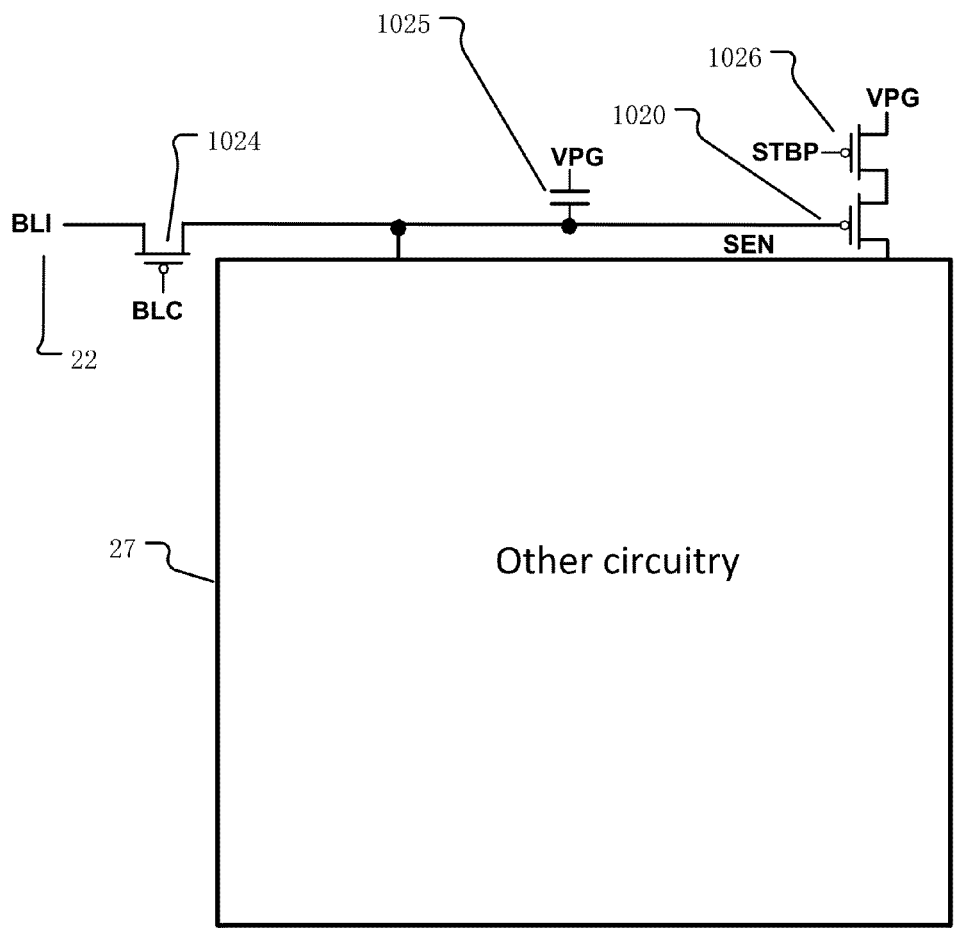
FIG. 10 is an example reverse sensing page buffer circuit which performs multiple sensing in the program verify step.

FIG. 10 is an example reverse sensing page buffer circuit which performs multiple sensing in the program verify step.

Bit line 22 is electrically coupled to and decoupled from sense node SEN 1020 by BLC 1024, bias of bit line 22, and bias of SEN 1020. SEN 1020 has a capacitance 1025 which is discharged at a rate which depends on the data stored on a memory cell coupled to the bit line 22. Bit line bias with a large cell current during discharge is lower than the bit line bias with a small cell current. SEN 1020 is coupled to the gate of a first p-type transistor. STBP 1026 is coupled to the gate of a second p-type transistor. The second p-type transistor is in series with the first p-type transistor in between SEN 1020 and other circuitry 27. Not shown are circuits that charge and discharge SEN 1020 via paths other than BLC 1024 and bit line 22.

During program verify in between two consecutive program shots, the program verify performs multiple sensing at node SEN 1020 of the same programmed memory cell or same programmed memory cells which just underwent programming. Alternatively, during the program verify in between a program shot, and program end, the program verify performs multiple sensing at node SEN of the same programmed memory cell or same programmed memory cells which just underwent programming.

The sense circuit can be modified with latches to store sense data or program data. The sense circuit can be modified to rearrange or add transistors and change transistor types with appropriate signaling changes.

Figure 11:
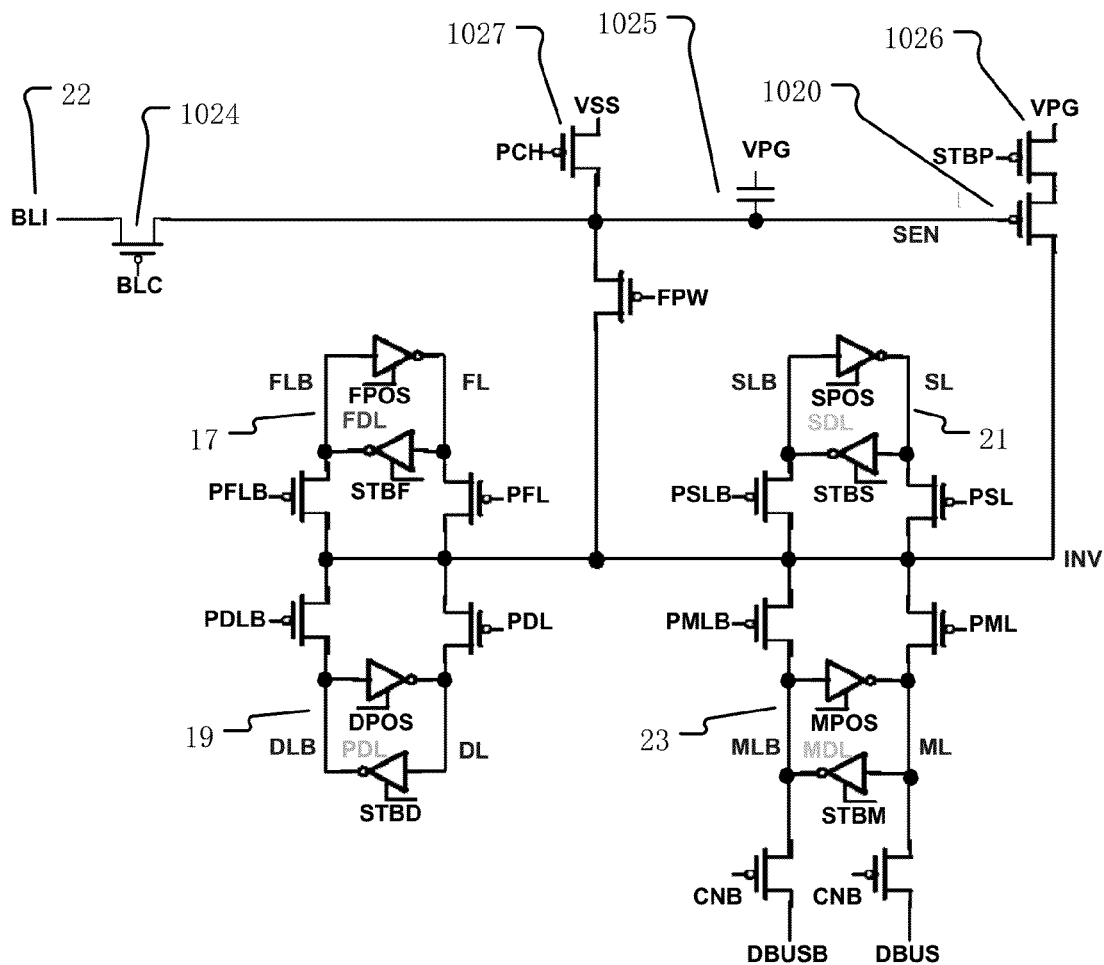
FIG. 11 is a more detailed example of the reverse sensing page buffer circuit of FIG. 10.

FIG. 11 is a more detailed example of the reverse sensing page buffer circuit of FIG. 10.

The page buffer circuit includes multiple latches: SDL 21, MDL 23, FDL 17, and PDL 19. The data latches SDL 21 and MDL 23 relate to programming and sensing the different bits of MLC data. The number of these data latches can be varied, based on the number of bits stored per cell.

The page buffer circuit includes a p-type transistor 1027 receiving a signal PCH which selectively couples a reference voltage VSS such as ground to SEN. When signal PCH provides a negative gate bias, then p-type transistor 1027 can pass 0V.

Figure 12:
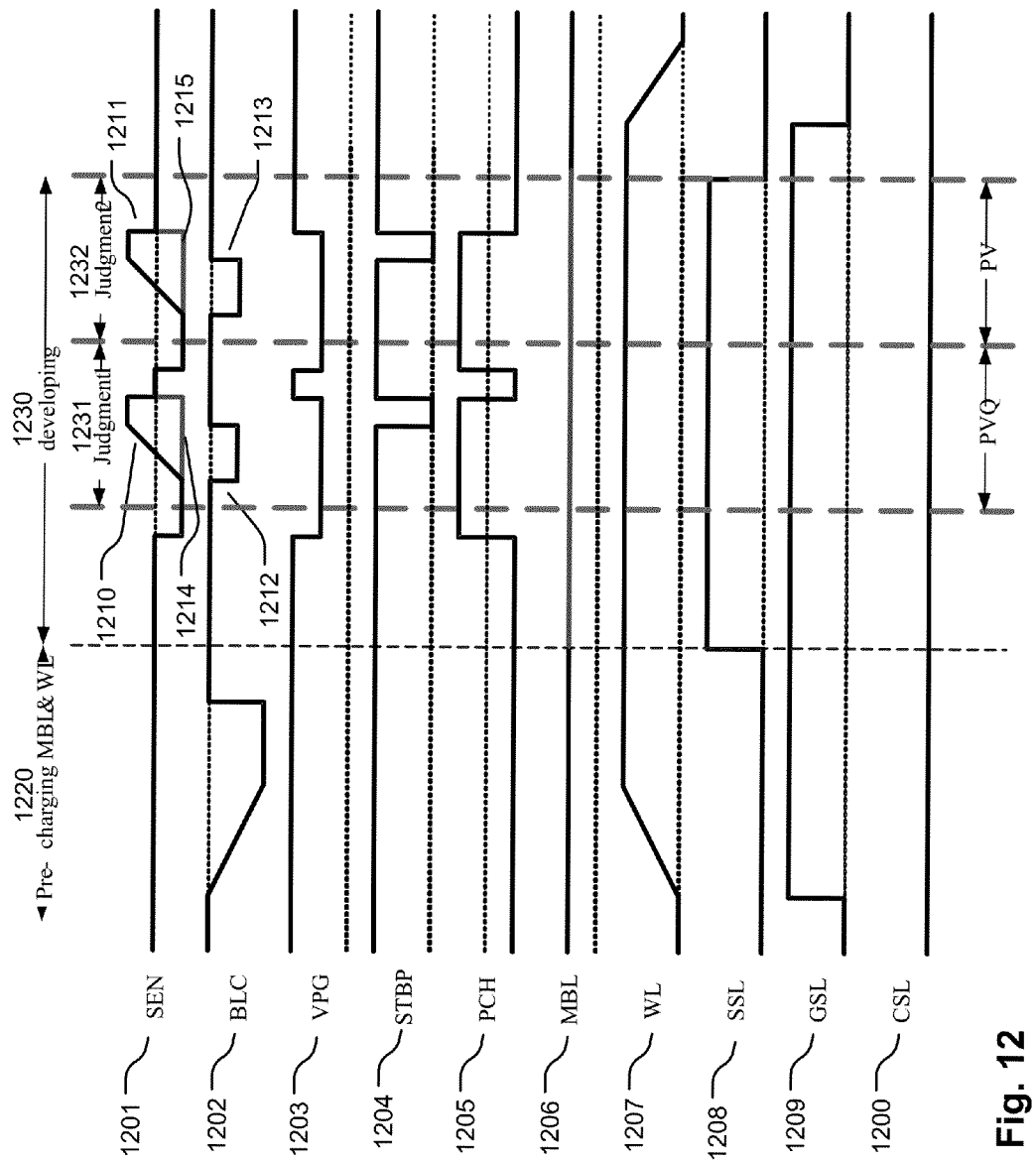
FIG. 12 is a graph of voltage traces with an example of a program verify phase which performs sensing multiple times, showing the same gate voltages on the pass transistor between the sense node and the bit line.

FIG. 12 is a graph of voltage traces with an example of a program verify phase which performs sensing multiple times, showing the same gate voltages on the pass transistor between the sense node and the bit line.

Shown are traces SEN 1201, BLC 1202, VPG 1203, STBP 1204, PCH 1205, MBL 1206, WL 1207, SSL 1208, GSL 1209, and CSL 1200. FIG. 12, like FIG. 7, shows a single program verify phase which performs sensing multiple times. In trace BLC 1202, first sensing is performed during pulse 1212 when the bit line is coupled to the sense node. During first sensing 1231, trace SEN 1231 rises from low to high 1210, or stays low 1214, determined by the data stored on the memory cell coupled to the bit line. At the conclusion of first sensing 1231, the value of SEN is indicative of the first sense data measured from the memory cell coupled to the bit line.

In trace BLC 1202, second sensing is performed during pulse 1213 when the bit line is coupled to the sense node. During second sensing 1232, trace SEN 1232 rises from low to high 1211, or stays low 1215, determined by the data stored on the memory cell coupled to the bit line. At the conclusion of second sensing 1232, the value of SEN is indicative of the second sense data measured from the memory cell coupled to the bit line.

In FIG. 12, in trace BLC 1202, the magnitudes of the first sensing pulse 1212 and the second sensing pulse 1213 are the same. Controlling the BLC with either the same or a different bias for the first sensing or the second sensing can make the first sensing time and the second sensing time tunable.

VPG 1203 goes from a high positive voltage to a less positive voltage before Judgment 1 1231, pushing SEN lower through capacitor receiving CLK. Also, VPG 1203 goes from a high positive voltage to a less positive voltage before Judgment 2 1232, pushing SEN low through capacitor receiving CLK. Each drop in VPG 1203, precedes sensing when BLC 1202 drops, turning on p-type transistor 1024 receiving BLC, and connecting BLI 22 to SEN.

Each drop in VPG 1203, is preceded by PCH 1205 having a low value, turning on p-type transistor 1027 and coupling VSS to SEN.

After each period when BLC 1202 drops, turning on p-type transistor 1024 receiving BLC, and connecting BLI 22 to SEN, a strobe occurs. STBP 1204 goes from high to ground, turning on p-type transistor 1026 receiving STBP. VPG 1203 is high before Judgment 1 1231, and VPG 1203 pulses high before Judgment 2 1232.

MBL 1206 stays the same during the multiple sensing.

Figure 13:
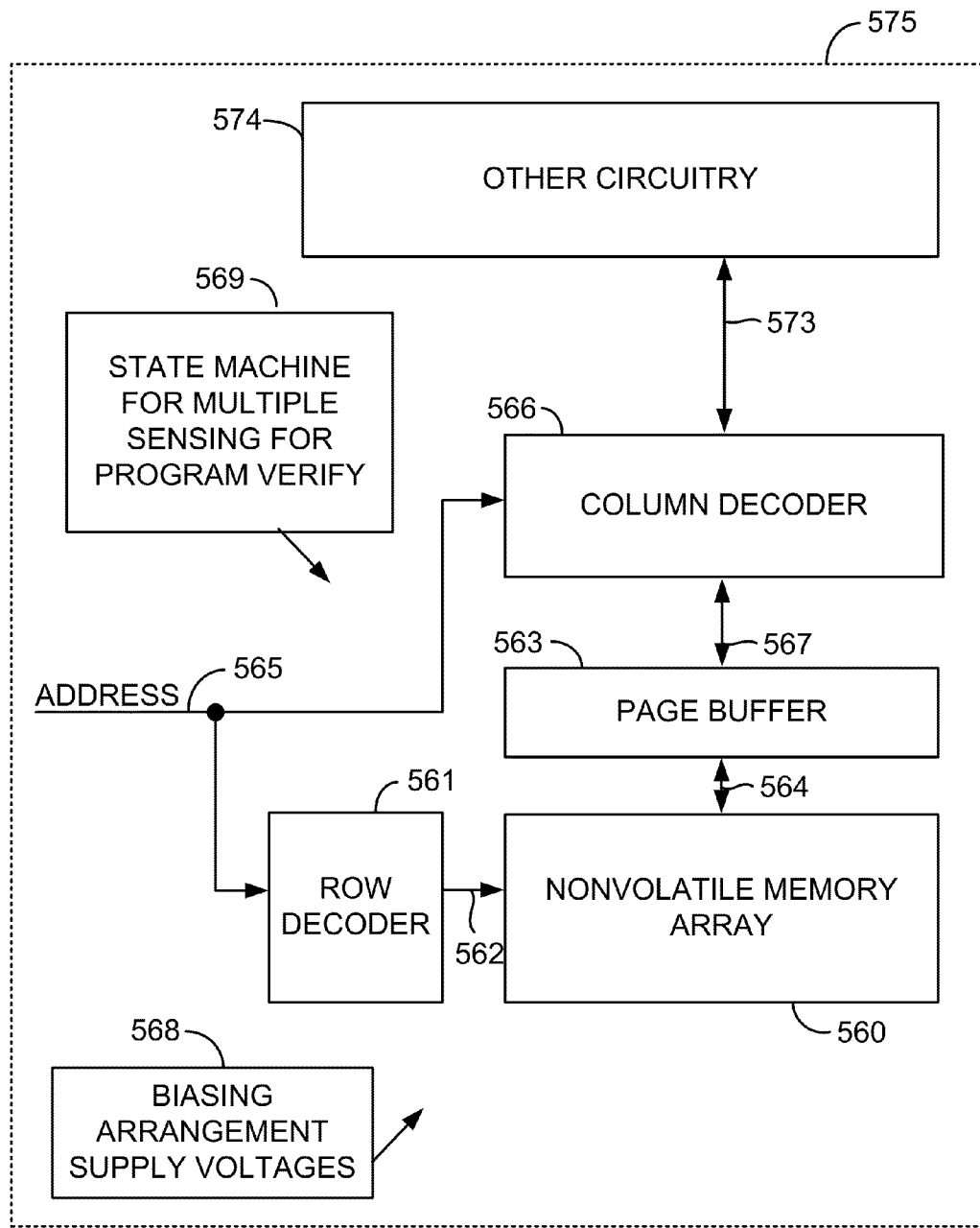
FIG. 13 is a block diagram of an integrated circuit with the disclosed control circuitry that performs multiple sensing in the program verify step of a program operation.

FIG. 13 is a block diagram of an integrated circuit with the disclosed control circuitry that performs multiple sensing in the program verify step of a program operation.

An integrated circuit 575 includes a flash memory array 560 performing multiple sensing during the program verify phase as described herein. A row decoder 561 is coupled to a plurality of word lines 562 arranged along rows in the memory array 560. Column decoders in block 566 are coupled to a set of page buffers 563 in this example via data bus 567. The global bit lines 564 are coupled to local bit lines (not shown) arranged along columns in the memory array 560. Addresses are supplied on bus 565 to column decoder (block 566) and row decoder (block 561). Data is supplied via the data-in line 573 from other circuitry 574 (including for example input/output ports) on the integrated circuit, such as a general purpose processor or special purpose application circuitry, or a combination of modules providing system-on-a-chip functionality supported by the array 560. Data is supplied via the line 573 to input/output ports or to other data destinations internal or external to the integrated circuit 575.

A controller, implemented in this example as a state machine 569, provides signals to control the application of the program operation such that in the program verify phase, multiple sensing is performed. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

While the current invention is disclosed by reference to the preferred HI embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An apparatus comprising:
    a sense circuit coupled to a bit line of a memory array;
    a pass transistor coupling the bit line to a sense node of the sense circuit and
    control circuitry coupled to the sense circuit, the control circuitry controlling a program operation for a memory cell including:
        a program verify phase in which the control circuitry causes the sense circuit to sense data stored on the memory cell multiple times during the program verify phase of program operation, the multiple times including a first time sensing the data from the memory cell and a second time sensing the data from the memory cell,
        wherein the control circuitry causes the pass transistor to receive a first gate voltage during the first time sensing the data, and the control circuitry causes the pass transistor to receive a second gate voltage during the second time sensing the data,
        wherein the control circuitry causes at least one of: (i) the first gate voltage and the second gate voltage are unequal, and (ii) a time period of the first time and a time period of the second time are unequal.

2. The apparatus of claim 1, further comprising:
    a word line applying a voltage with only a non-zero value to the memory cell.

3. The apparatus of claim 1,
wherein the control circuitry causes the pass transistor to turn on, to sense the data for the first time and to sense the data for the second time.

4. The apparatus of claim 3, wherein the sense node has a voltage capacitively coupled to a sense level signal,
wherein the control circuitry causes the sense level signal to lower the sense node voltage prior (i) to sensing the data for the first time and then cause the sense level signal to raise the sense node voltage after the first time, and
(ii) to sensing the data for the second time and then cause the sense level signal to raise the sense node voltage after the second time.

5. The apparatus of claim 3, wherein the bit line has a constant voltage while the control circuitry senses the data for the first time and the data for the second time.

6. The apparatus of claim 1,
wherein the first gate voltage and the second gate voltage are equal.

7. The apparatus of claim 1, further comprising a main bit line, and a plurality of local bit lines coupled to the main bit line, the plurality of local bit lines including a bit line coupled to the memory cell,
wherein the control circuitry does not refresh a main bit line voltage of the main bit line.

8. The apparatus of claim 1,
wherein the control circuitry causes the sense node to fall to a negative voltage (i) prior to sensing the data during the first time, and (ii) prior to sensing the data during the second time.

9. The apparatus of claim 8,
wherein the control circuitry couples the sense node to a ground voltage: (i) prior to falling to the negative voltage prior to sensing the data during the first time, and (ii) prior to falling to the negative voltage prior to sensing the data during the second time.

10. The apparatus of claim 9,
wherein the control circuitry couples the sense node to the ground voltage via a p-type transistor receiving a negative gate voltage.

11. The apparatus of claim 8,
wherein the sense node is coupled to a first gate of a first sense transistor, the first sense transistor coupled in series with a second sense transistor, the second sense transistor having a second gate receiving a strobe signal, a first current carrying terminal coupled to a positive reference voltage, and a second current carrying terminal coupled to the first sense transistor, and
wherein the control circuitry causes the sense node to rise to a positive voltage: (i) prior to the control circuitry causing the strobe signal to turn on the second sense transistor prior to the first time, and (i) prior to the control circuitry causing the strobe signal to turn on the second sense transistor prior to the second time.

12. A method comprising:
performing a multi-phase program operation on a memory cell, including:
performing a program phase in which the memory cell in the memory array is programmed; and
performing a program verify phase that senses data stored on the memory cell multiple times during the program verify phase of the program operation, the multiple times including a first time sensing the data from the memory cell and a second time sensing the data from the memory cell, including:
causing a pass transistor coupling the bit line to a sense node of the sense circuit to receive a first gate voltage during the first time sensing the data; and
causing the pass transistor to receive a second gate voltage during the second time sensing the data,
causing at least one of: (i) the first gate voltage and the second gate voltage are unequal, and (ii) a time period of the first time and a time period of the second time are unequal.

13. The method of claim 12, further comprising:
during the program verify, applying the gate voltage with only a non-zero value to the memory cell.

14. The method of claim 12, further comprising:
causing the pass transistor to electrically couple a bit line to the sense node to sense the data for the first time and then electrically decouple the bit line from the sense node after the first time; and
causing the pass transistor to electrically couple the bit line to the sense node to sense the data for the second time and then electrically decouple the bit line from the sense node after the second time.

15. The method of claim 12, further comprising:
wherein the first gate voltage and the second gate voltage are equal.

16. The method of claim 12, wherein the second gate voltage is less than the first gate voltage.

17. The method of claim 12, wherein magnitudes of the second gate voltage and the first gate voltage are determined by a main bit line voltage of a main bit line, the main bit line coupled to the bit line.

18. The method of claim 12, further comprising:
during program verify, a main bit line voltage of the main bit line is not refreshed.

* * * * *